United States Patent
Iwata et al.

(10) Patent No.: US 6,617,191 B1
(45) Date of Patent: *Sep. 9, 2003

(54) METHOD FOR ANODIZING SILICON SUBSTRATES FOR SURFACE TYPE ACCELERATION SENSORS

(75) Inventors: Hitoshi Iwata, Aichi (JP); Makoto Murate, Aichi (JP)

(73) Assignee: Kabushiki Kaisha Tokai Rika Denki Seisakusho, Aichi (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/445,124

(22) PCT Filed: Jun. 4, 1998

(86) PCT No.: PCT/JP98/02475

§ 371 (c)(1),
(2), (4) Date: Dec. 2, 1999

(87) PCT Pub. No.: WO98/56035

PCT Pub. Date: Dec. 10, 1998

(30) Foreign Application Priority Data

Jun. 5, 1997 (JP) ............................................. 9-147857
Dec. 22, 1997 (JP) ............................................. 9-353686

(51) Int. Cl.⁷ ............................................. H01L 21/00
(52) U.S. Cl. ........................... 438/50; 438/50; 438/466; 438/960
(58) Field of Search ..................... 156/644.1; 438/52, 438/960, 466, 432, 330; 216/62, 87

(56) References Cited

U.S. PATENT DOCUMENTS

| | | | | |
|---|---|---|---|---|
| 4,484,212 A | * | 11/1984 | Komatsu et al. | 257/536 |
| 5,549,785 A | * | 8/1996 | Sakai et al. | 438/52 |
| 5,665,250 A | * | 9/1997 | Iwata et al. | 438/52 |

FOREIGN PATENT DOCUMENTS

| | | |
|---|---|---|
| JP | 2-159770 | 6/1990 |
| JP | 8-111533 | 4/1996 |

* cited by examiner

*Primary Examiner*—George Fourson
*Assistant Examiner*—Julio J. Maldonado
(74) *Attorney, Agent, or Firm*—Townsend and Townsend and Crew, LLP

(57) ABSTRACT

An epitaxial growth layer, an oxide film, and a passivation film are formed on a silicon substrate. Except for an opening formed on a part of the passivation film, the upper surface of the passivation film is covered with a metal protective film made of tungsten (W). With the silicon substrate immersed in a high-concentration hydrofluoric aqueous solution, anodization is performed with the silicon substrate as an anode and the metal protective film as a counter electrode.

14 Claims, 8 Drawing Sheets

Fig.4
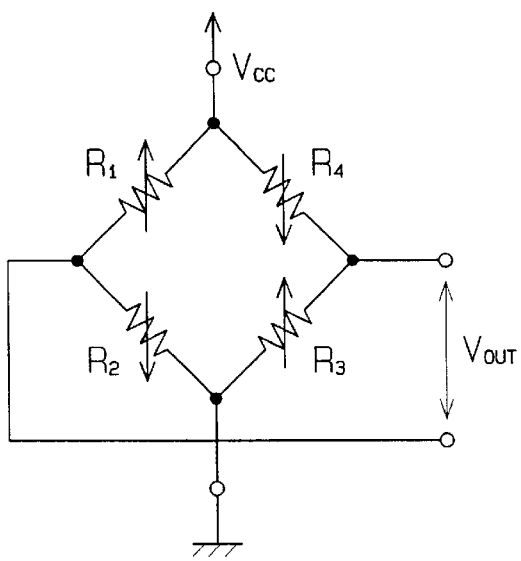
Fig.5(a)          Fig.5(b)
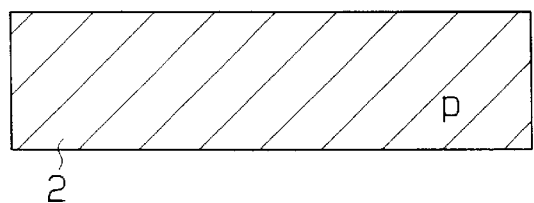   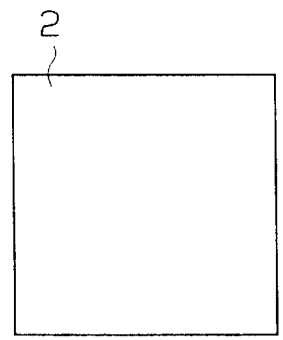
Fig.6(a)          Fig.6(b)
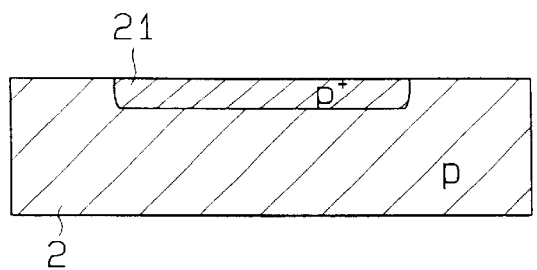   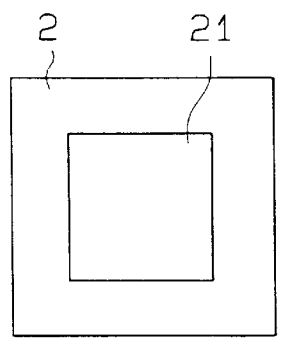

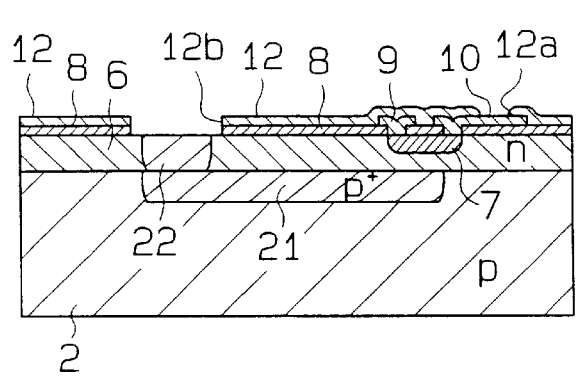
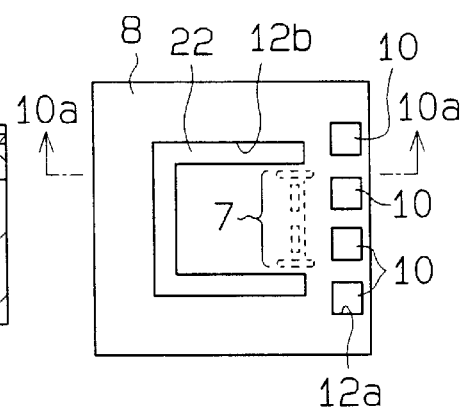
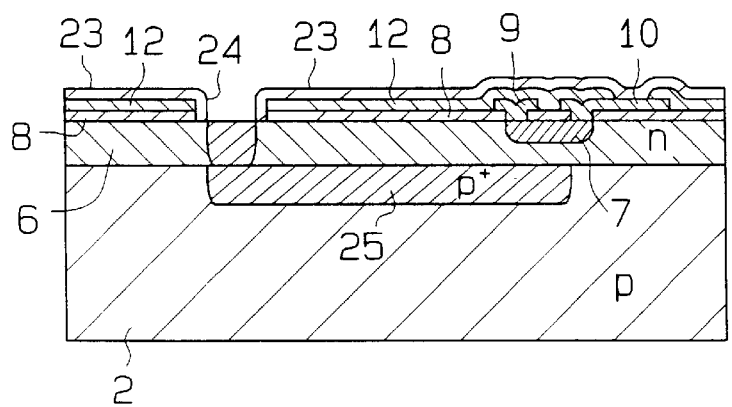

METHOD FOR ANODIZING SILICON SUBSTRATES FOR SURFACE TYPE ACCELERATION SENSORS

BACKGROUND OF THE INVENTION

The present invention relates to a method for anodizing silicon substrates and a method for manufacturing a surface-type acceleration sensor using the anodizing method.

Anodization of silicon substrates has conventionally been practiced in micro machining of silicon. FIG. 18 shows a conventional method of anodization. A silicon substrate 29 and a counter electrode 31 are immersed in an aqueous HF solution (aqueous hydrofluoric solution). The silicon substrate is an anode and the counter electrode 31 is made, for example, of Pt (platinum). An electric field is applied to the silicon substrate 29 and the counter electrode 31. The silicon substrate 29 includes a first portion, which will be porous, and a second portion, which excludes the first portion. The surface of the second portion of the silicon substrate 29 is covered with a resin film (protection film) 30 such as a photoresist for protection from the HF solution 27. During anodization, the first portion of the silicon substrate 29 becomes a porous silicon layer 25. In a later step, the layer 25 is removed by alkali etching to form a cavity in the silicon substrate 29.

However, since the resin film 30 does not closely contact the silicon substrate 29, the HF solution 27 may enter the space between the film 30 and the silicon substrate 29. This erodes the second portion of the silicon substrate 29.

To solve the above problem, a ceramic film, which has HF resistance, may be used instead of the resin film 30. However, the ceramic film is hard to form and is made by a different manufacturing process than an IC manufacturing process. This makes the ceramic film unsuitable for forming elements such as an acceleration sensor, the manufacturing process of which is close to the IC manufacturing process.

An objective of the present invention is to provide a method of anodization in which only a required portion of a silicon substrate is made porous.

Another objective of the present invention is to provide a method for manufacturing an improved surface-type accelerator sensor using the anodization method.

SUMMARY OF THE INVENTION

To achieve the above objectives, in the anodization of a silicon substrate of the present invention, the silicon substrate includes a first portion, which is made porous, and a second portion, which excludes the first portion. A metal protective film having HF resistance is formed on the surface of the second portion of the silicon substrate. During the formation of the metal protective film, a metal silicide having HF resistance is formed between the metal protective film and the silicon substrate. The silicon substrate covered with the metal protective film is immersed in the HF solution, a positive terminal of a direct current power source is connected to the silicon substrate, which serves as an anode, and a voltage is applied to the silicon substrate.

In the present invention, the metal protective film and the metal silicide are made of HF resistant metals, which include W (tungsten) and Mo (molybdenum). When the silicon substrate is immersed in and eroded by the HF solution during anodization, the portion covered with the metal protective film and the metal silicide are effectively protected. As a result, the surface of the silicon substrate covered by the metal protective film is not corroded by the HF solution.

In a method of the present invention for manufacturing a surface-type acceleration sensor, a first p-type silicon layer is formed on a predetermined area of a surface of a p-type single crystal silicon substrate by adding impurities. An epitaxial growth layer, which is made of n-type single crystal silicon, is formed on the upper surface of the p-type single crystal silicon substrate, such that the first p-type silicon layer is covered by the epitaxial growth layer. A second p-type silicon layer for forming an opening portion is formed in the epitaxial growth layer by adding impurities. A deformation gage, which is made of p-type silicon, is formed on the upper surface of the epitaxial growth layer. A wiring pattern, which is connected to the deformation gage, is then formed. A passivation film is formed to cover the wiring pattern with the second p-type silicon layer exposed. A metal protective film having HF resistance is formed on the surface of the passivation film and the epitaxial growth layer but not on the second p-type silicon layer. A metal silicide having HF resistance is formed between the metal protective film and the epitaxial growth layer. Anodization is performed to convert the first and second p-type silicon layers into porous silicon layers. The porous silicon layers are removed by alkali etching to form a beam, which is made of the epitaxial growth layer.

DESCRIPTION OF THE DRAWINGS

FIG. 4 shows an equivalent circuit diagram of the acceleration sensor;

FIG. 5(*a*) is a diagrammatic cross-sectional view showing the acceleration sensor during a first manufacturing step;

FIG. 5(*b*) is a diagrammatic plan view of the sensor of FIG. 5(*a*);

FIG. 6(*a*) is a diagrammatic cross-sectional view of the sensor in a second manufacturing step, following the step of FIG. 5(*a*);

FIG. 6(*b*) is a diagrammatic plan view of the sensor of FIG. 6(*a*);

FIG. 7(*b*) is a diagrammatic plan view of the sensor of FIG. 7(*a*);

FIG. 8(*b*) is a diagrammatic plan view of the sensor of FIG. 8(*a*);

FIG. 9(*b*) is a diagrammatic plan view of the sensor of FIG. 9(*a*);

FIG. 10(*a*) is a diagrammatic cross-sectional view of the sensor taken on line 10*a*—10*a* in a sixth manufacturing step, following the step of FIG. 9(*a*);

FIG. 10(*b*) is a diagrammatic plan view of the sensor of FIG. 10(*a*);

FIG. 11 is a diagrammatic cross-sectional view of the sensor in a seventh manufacturing step, following the step of FIG. 10(a);

BEST MODE FOR CARRYING OUT THE INVENTION

First Embodiment

Figure 1:
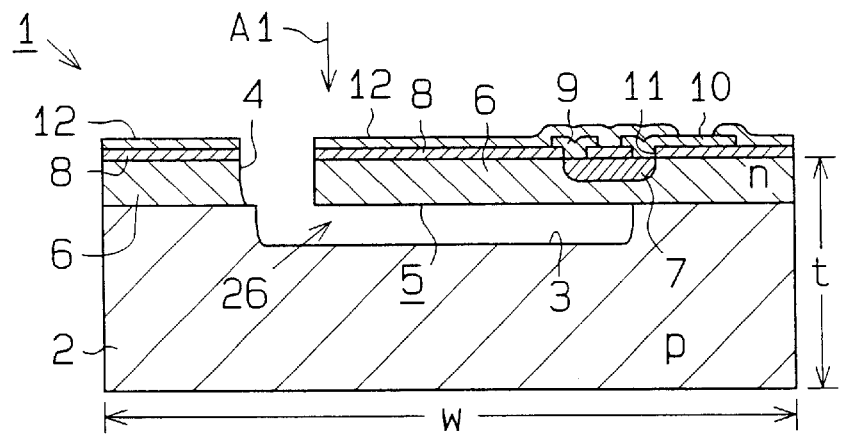
FIG. 1 is a diagrammatic cross-sectional view showing a surface-type acceleration sensor according to a first embodiment of the present invention.
Figure 2:
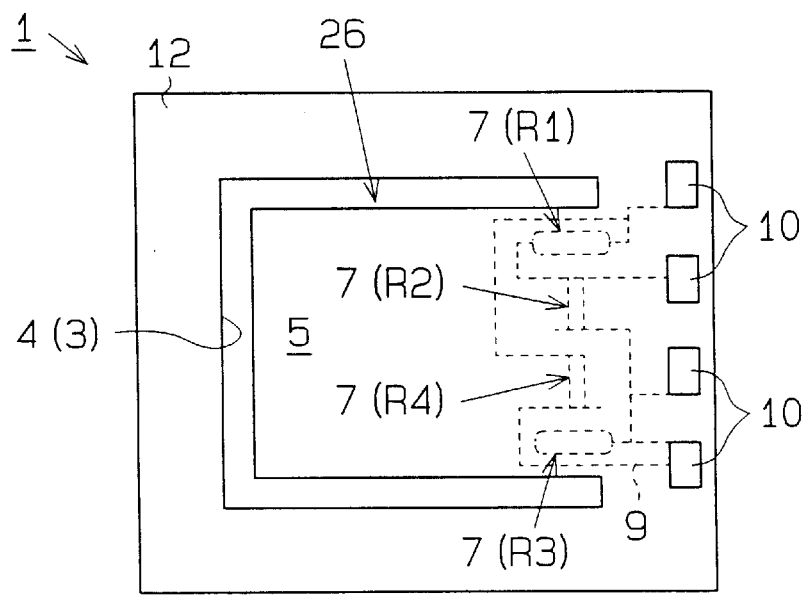
FIG. 2 is a diagrammatic plan view showing the acceleration sensor of FIG. 1.

A first embodiment of the present invention will now be described with reference to FIGS. 1–13. As shown in FIGS. 1 and 2, a surface-type acceleration sensor 1 of the first embodiment includes a p-type single crystal silicon substrate (hereinafter referred simply to as silicon substrate) 2. The silicon substrate 2 has an orientation flat (110). The silicon substrate 2 of the acceleration sensor 1 is formed on a wafer by scribing, which is different from later mentioned manufacturing steps.

A generally square recess 3 is located in the top central surface of the silicon substrate 2. The recess 3 is formed by removing a porous p-type silicon layer by alkali etching. A cantilever beam 5, which is supported by a single side, is located above the recess 3 to move vertically. The cantilever beam 5 is mainly made of an n-type single crystal silicon epitaxial growth layer 6. Four diffusion-type deformation gages 7, which are made of p-type silicon by adding impurities, are formed on the top surface of the proximal end of the cantilever beam 5.

A thin oxide film (SiO$_2$) 8 which serves as an insulating layer between layers is formed on the epitaxial growth layer 6. A wiring pattern 9 and a bonding pad 10 are formed on the oxide film 8 by a physical film forming method, such as sputtering or vacuum vapor deposition. Contact holes 11 for connecting layers are formed on the ends of the deformation gages 7. The contact holes 11 are used to electrically connect the wiring patterns 9 to the deformation gages 7 below the wiring patterns 9. The wiring patterns 9 are electrically connected to the bonding pads 10, which are exposed on the peripheral upper surface of the silicon substrate 2. A thin passivation film 12 for insulation at the top layer is formed on the upper surface of the oxide film 8 by a physical film forming method. Openings are formed on predetermined portions of the passivation film 12 to expose the bonding pads 10. The epitaxial growth layer 6, the oxide film 8, and the passivation film 12 form a generally U-shaped opening 4.

The preferred dimensions of each part of the acceleration sensor 1 are as follows. The thickness t of the silicon substrate 2 (including the epitaxial growth layer 6) is about 500 μm, and the width w is 500 μm–1000 μm. The thickness of the cantilever beam 5 is about 10 μm, the width is about 200 μm, and the length is about 300 μm. A clearance between the lower surface of the cantilever beam 5 and the bottom surface of the recess 3 is about 10 μm. The thickness of the oxide film 8 is about 0.5 μm, and the thickness of the passivation film 12 is also about 0.5 μm.

Figure 3:
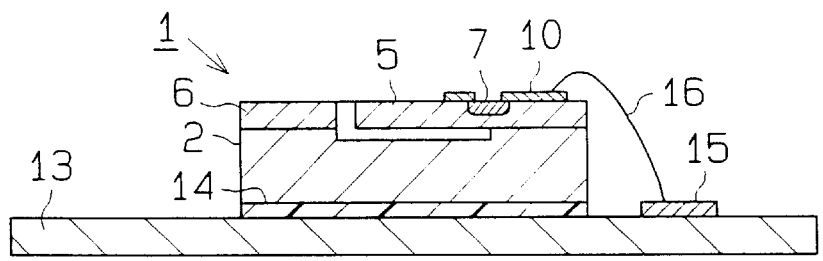
FIG. 3 is a diagrammatic cross-sectional view showing the acceleration sensor when mounted on a substrate.

As shown in FIG. 3, the acceleration sensor 1 is installed on another substrate (motherboard) 13. A die bond material 14 is applied to the entire lower surface of the silicon substrate 2, and the silicon substrate 2 is attached to the motherboard 13 with the die bond material 14. The bonding pads 10 of the silicon substrate 2 are electrically connected to a bonding pad 15 of the motherboard 13 with a wire 16 via wire bonding. Further, the motherboard 13 includes a signal processing circuit (not shown), which calculates acceleration based on the output voltage from the acceleration sensor 1.

The deformation gages (that is, diffusion deformation resistors R1–R4) are connected as shown in FIG. 4. Of the bridge-connected four resistors R1–R4, a first node between the resistor R1 and the resistor R4 is connected to a bonding pad 10 for supplying voltage Vcc from a power source. A second node between the resistor R2 and R3 is connected to a bonding pad 10 which may be connected to ground. Nodes between the resistors R3 and R4 and between the resistors R1 and R2 are respectively connected to two bonding pads 10 for the output of the sensor 1. FIG. 2 shows a schematic layout of the resistors R1–R4 in the cantilever beam 5. The resistors R1–R4 are substantially aligned in the widthwise direction of the cantilever beam 5. The longitudinal direction of the resistors R1, R3 is parallel to the direction in which the cantilever beam 5 extends. The longitudinal direction of the resistors R2, R4 is perpendicular to the direction in which the cantilever beam 5 extends. Accordingly, the resistors R1, R3 extend in the direction of [110], and the resistors R2, R4 extend in the direction of [/1, /1, 0].

When acceleration is applied to the acceleration sensor 1 as shown by the arrow A1 of FIG. 1, the proximal portion of the cantilever beam 5 curves and the entire cantilever moves downward. This deforms the deformation gages 7 (resistors R1–R4), which either increases or decreases the resistance of each deformation gage 7 as caused by the Piezo resistance effect of silicon. Acceleration is detected by detecting the changes of resistance of each deformation gage 7.

A method for manufacturing the acceleration sensor 1 of the present embodiment will now be described with reference to FIGS. 5–13. In the manufacturing method, the silicon substrate 2 is formed on a wafer (not shown for simplification of illustration).

First, as shown in FIGS. 5(a), 5(b), the p-type single crystal silicon substrate 2, which is a generally rectangular parallelepiped and has an orientation flat (110), is prepared. A mask (not shown) is formed on the surface of the silicon substrate 2. Subsequently, boron is introduced into the silicon substrate 2 by ion implantation, and the boron is diffused by heat. As a result, as shown in FIGS. 6(a) and 6(b), a p-type silicon layer 21 is formed substantially in the center of the silicon substrate 2.

Figure 7A:
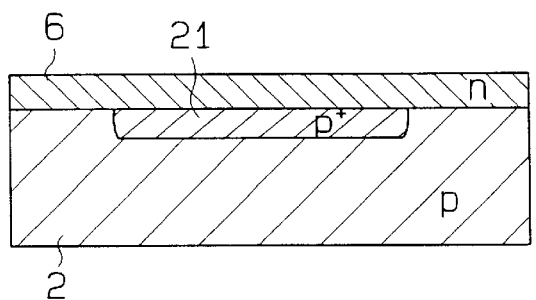
FIG. 7(*a*) is a diagrammatic cross-sectional view of the sensor in a third manufacturing step, following the step of FIG. 6(*a*)
Figure 7B:
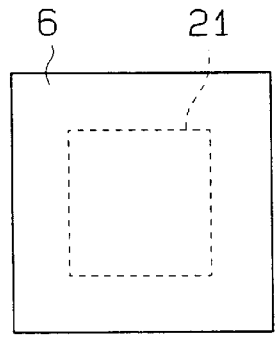

As shown in FIGS. 7(a) and 7(b), the epitaxial growth layer 6, which is made of n-type single crystal silicon, is formed by vapor phase epitaxy on the upper surface of the silicon substrate 2 that includes the p-type silicon layer 21. As a result, p-type silicon layer 21 is embedded in the epitaxial growth layer 6. Then, a mask (not shown) is formed on the surface of the epitaxial growth layer 6, and a generally U-shaped opening is formed on a predetermined area of the mask by photo etching.

Figure 8A:
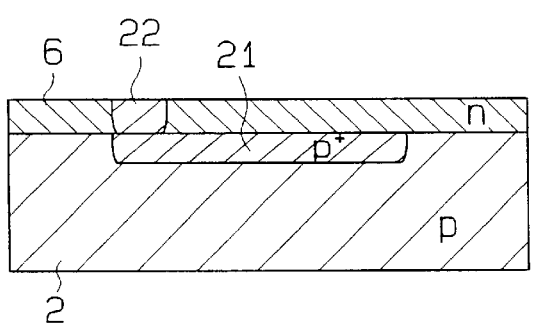
FIG. 8(*a*) is a diagrammatic cross-sectional view of the sensor in a fourth manufacturing step, following the step of FIG. 7(*a*)
Figure 8B:
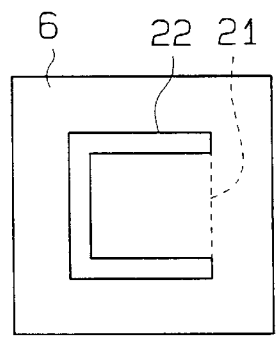

Then, boron is introduced into the silicon substrate 2 by, for example, ion implanting, and the boron is diffused by heat to form the p-type silicon layer 22 for the U-shaped opening as shown in FIG. 8. The p-type silicon layer 22 is flush with the surface of the epitaxial growth layer 6 and contacts the p-type silicon layer 21

Figure 9A:
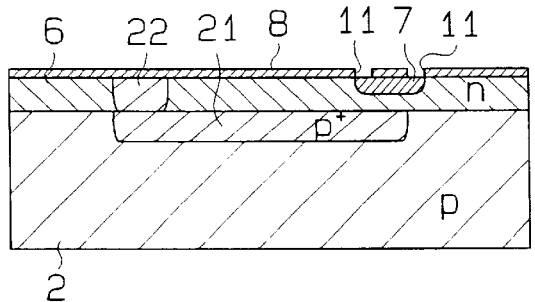
FIG. 9(*a*) is a diagrammatic cross-sectional view of the sensor taken on line 9*a*—9*a* in a fifth manufacturing step following the step of FIG. 8(*a*)
Figure 9B:
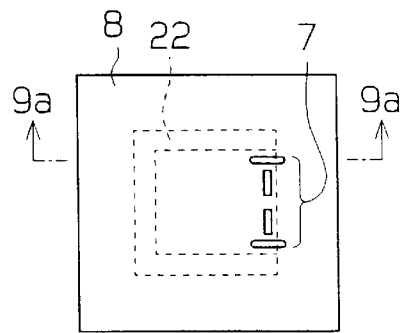

Then, the mask (not shown) is arranged on the upper surface of the epitaxial growth layer 6. Boron is introduced into the silicon substrate 2 by ion implantation and the boron is diffused by heat, which forms four deformation gages 7 at a part that will later become the upper surface of the proximal end of the cantilever 5. Next, the silicon substrate 2 is heated in oxygen or air, which forms the oxide film 8 on the upper surface of the silicon substrate 2. Subsequently, photo etching is performed on the oxide film 8, which forms the contact hole 11 at a predetermined portion of the oxide film 8 as shown in FIG. 9.

Then, photolithography is performed on the silicon substrate 2 after sputtering or vacuum vapor deposition using Al (aluminum) is carried out. This forms the wiring pattern 9 and the bonding pads 10. Subsequently, as shown in FIG. 10, the passivation film 12 is formed on the upper surface of the silicon substrate 2 to cover the wiring patterns 9 by depositing SiN or $Si_3N_4$ by CVD (chemical vapor deposition). In the formation of the passivation film 12, openings 12a for exposing the bonding pads 10 and a generally U-shaped opening 12b are formed in the passivation film 12. Then, part of the oxide film 8 that is over the p-type silicon layer 22 is removed, which exposes the upper surface of the p-type silicon layer 22.

Subsequently, the entire upper surface of the passivation film 12 is covered by the metal protective film 23, which is made of W (tungsten), by a physical film forming method, such as sputtering or vacuum vapor deposition. During the film formation, below the opening 12b (i.e. at the opening of the oxide film 8), W silicide is formed on the interface between the metal protective film 23 and the epitaxial growth layer 6. W (tungsten), which forms the metal protective film 23, and W silicide are HF-resistant. In the next step, as shown in FIG. 11, the generally U-shaped opening 24 is formed above the p-type silicon layer 22 by photolithography.

Figure 12:
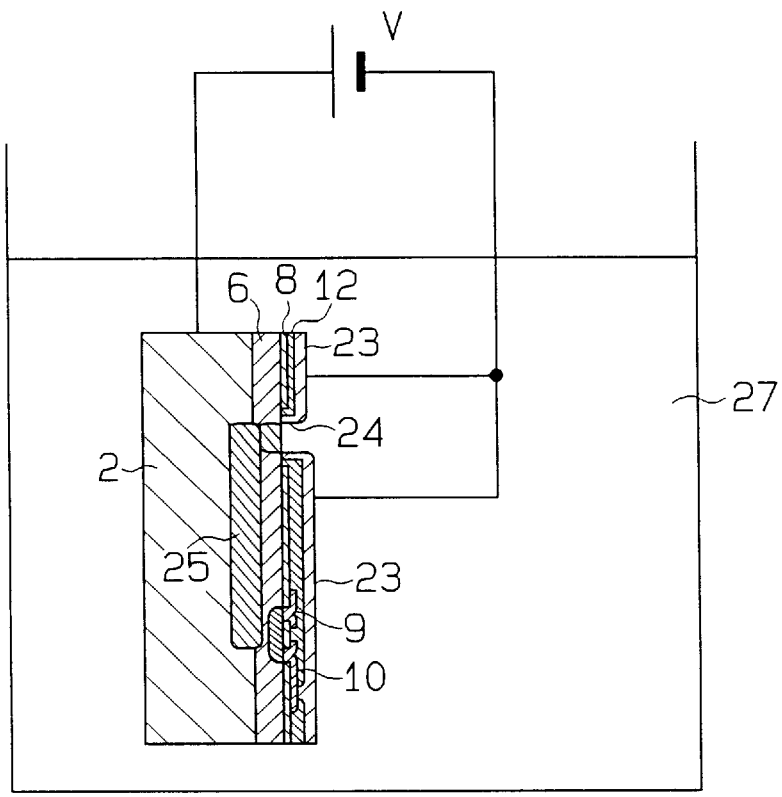
FIG. 12 is a diagrammatic cross sectional view of the sensor in a method of anodization.
Figure 13:
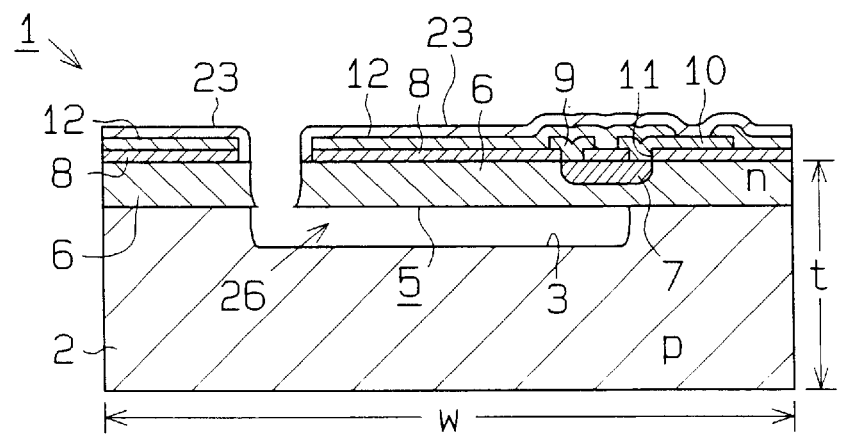
FIG. 13 is a diagrammatic cross-sectional view showing the acceleration sensor after the anodization step.

As shown in FIG. 12, the silicon substrate 2 is immersed in a high-concentration HF aqueous solution as a solution containing HF. A positive terminal of a DC electrode V is connected to the silicon substrate 2, and the negative terminal is connected to the metal protective film 23. The silicon substrate 2 is an anode, and the metal protective film 23 is a counter electrode. Voltage is applied between the silicon substrate 2 and the metal protective film 23. At this time, the applied voltage does not exceed 0.6V and optimum voltage is applied. In this way, only the p-type silicon layers 21, 22 are selectively turned porous by anodization, which converts only the designated areas into the porous silicon layer 25. The portion that is covered by the metal protective film 23 is not corroded by the HF aqueous solution. Since HF-resistant W silicide is formed on the interface between the metal film 23 and the epitaxial growth layer 6 in the opening 12b, the HF aqueous solution does not penetrate the interface and corrode the inside.

Subsequently, the porous silicon layer 25 is subjected to anisotropic etching by means of alkali etching using THAM (tetramethyl ammonium hydroxide). The p-type silicon layers 21, 22 that have undergone the anodization and have become porous are readily soluble in alkali. As a result, the cavity 26 is easily formed by removing the porous silicon layer 25 (See FIG. 13). Finally, the metal protective film 23, which is now no longer necessary, is removed by etching such as plasma etching, which completes the acceleration sensor 1 as shown in FIG. 1.

In the acceleration sensor 1 of the present invention, the cantilever beam 5 is mainly made of n-type single crystal silicon epitaxial growth layer 6. Therefore, the deformation gage 7, which is made of p-type silicon having a relatively large gage factor, can be formed on the upper surface of the epitaxial growth layer 6. This makes the acceleration sensor 1 more sensitive than the conventional acceleration sensors having a deformation gage made of n-type silicon.

The acceleration sensor 1 is a so-called surface sensor, which is manufactured without performing anisotropic etching on the lower surface of the silicon substrate 2. Therefore, the problem in conventional bulk-type acceleration compressors (that is, the width of a chip width W is increased by forming etching holes along the flat (111)) is solved. The size of the acceleration sensor 1 is reduced without degrading the predetermined detection sensitivity. Further, the cantilever beam 5 of the surface-type acceleration sensor 1 is not exposed from the bottom surface of the silicon substrate 2 and does not contact the die bond material 14 and motherboard 13. Accordingly, a seat for the acceleration sensor 1 is not required, which facilitates installation of the acceleration sensor 1.

The manufacturing method of the present embodiment has the following advantages.

Figure 18:
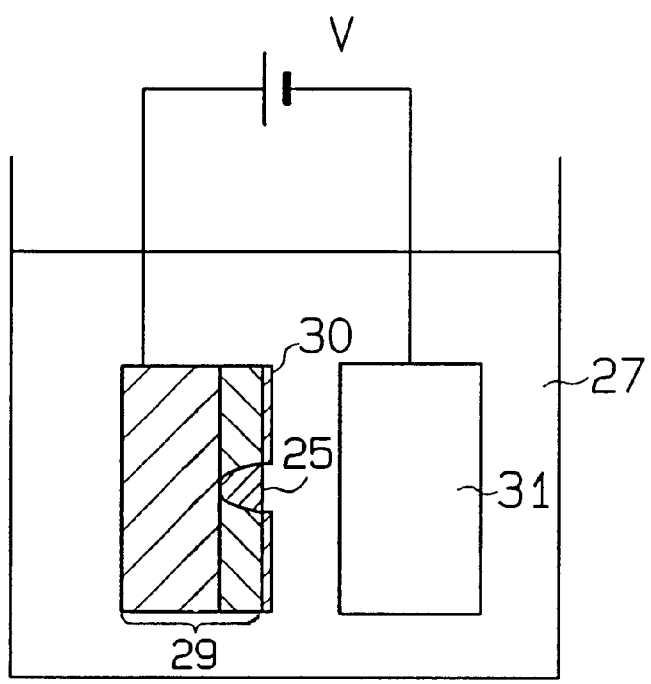
FIG. 18 is a diagrammatic cross-sectional view showing a prior art method of anodization.

(1) In the prior art anodization of FIG. 18, the area of the counter electrode 31 must be equal to the area of the silicon substrate 29 to perform an equal anodization. In contrast, in the anodization of the present embodiment, the metal protective film 23 is used as a counter electrode, which does not necessitate a counter electrode that is made of a precious metal plate. Therefore, the anodization of the present embodiment is less expensive than that of the prior art. Also, since the metal protective film is formed on substantially the entire surface of the silicon substrate 2, anodization is equally performed.

Further, since the metal protective film 23, which is located close to the silicon substrate 2, is used as a counter electrode, the resistance of the HF aqueous solution does not have to be considered. In the prior art anodization, since the silicon substrate is distant from the counter electrode, it is necessary to control the current or the voltage of the DC power source V during anodization considering the resistance of the HF aqueous solution. In the present embodiment, anodization is facilitated since the resistance of the HF aqueous solution does not have to be considered.

(2) During anodization of the present embodiment, the applied voltage does not exceed 0.6V. If voltage that exceeds 0.6V is applied during anodization, leakage current (invalid current), which is not relevant to anodization, flows in the pn junction of the silicon substrate 2 and the epitaxial growth layer 6 through the wiring pattern 9, since the pn junction forms a diode. In the present embodiment, since voltage that is less than 0.6V is applied and the flow of leakage current is prevented, anodization is efficiently performed.

(3) The metal protective film 23, which is made of W (tungsten), has a high fusion point and a coefficient of thermal expansion that is close to that of the passivation film 12 made of SiN or $Si_3N_4$ and the epitaxial growth layer 6. Therefore, the metal protective film 23 closely contacts and does not peel off of the passivation film 12 and the epitaxial growth layer 6.

(4) The p-type silicon layers 21, 22 are formed on predetermined areas in advance and are then anodized.

Therefore, the anodized portions have uniform shape and depth in comparison with the prior art anodization, in which the surface of the silicon substrate 2 is directly anodized.

(5) It is not so difficult to form the epitaxial growth layer 6 on the p-type silicon layer 21.

(6) The anodization is performed after the passivation step is completed, which enables forming the metal protective film 23 when the cavity 26 has not yet been formed. This facilitates the formation of the metal protective film 23.

In other words, since the metal protective film 23 does not get inside the cavity 26, there is no need to remove the metal protective film 23. Also, since the alkali etching is performed after the passivation step, the wiring patterns 9 and the bonding pads 10 are not contaminated by etchant. Therefore, the manufacturing of the acceleration sensor 1 is simplified, which facilitates the work.

(7) The manufacturing method, in which the porous silicon layer 25 is removed, is not restricted by the orientation flat of the silicon substrate 2.

Also, the manufacturing method of the present invention (including the anodization method using tungsten as the metal protective film 23), is similar to the method of manufacturing bipolar IC, in which W (tungsten) is used as a material for the gates of the transistors. Accordingly, the acceleration sensor 1 and the bipolar IC can be integrated on the same circuit, which contributes to reducing the size and increasing the speed of the acceleration sensor 1.

Second Embodiment

A method of manufacturing the acceleration sensor 1 according to a second embodiment of the present invention will now be described with reference to FIGS. 14–17. The same reference numerals are used to refer to the same members as those of the first embodiment, and the description for such members is omitted.

Figure 14:
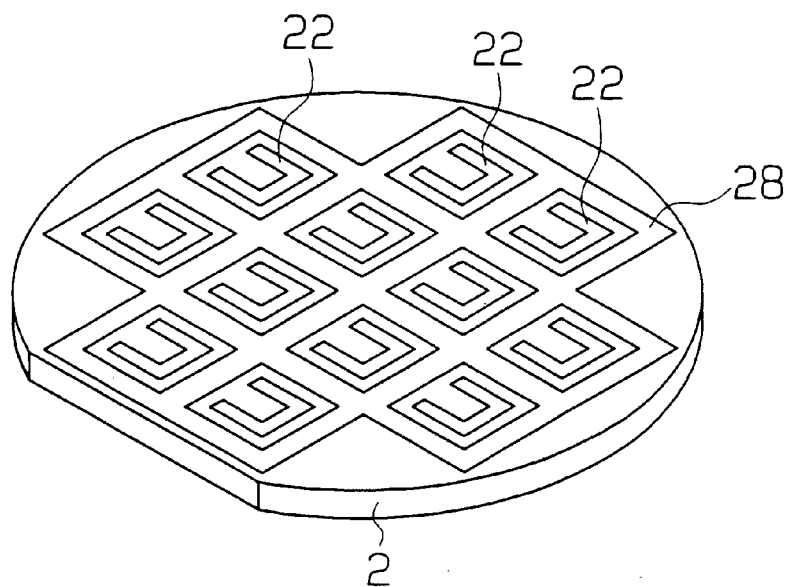
FIG. 14 is a diagrammatic perspective view showing a plurality of acceleration sensors formed on a wafer according to a second embodiment of the present invention.
Figure 15:
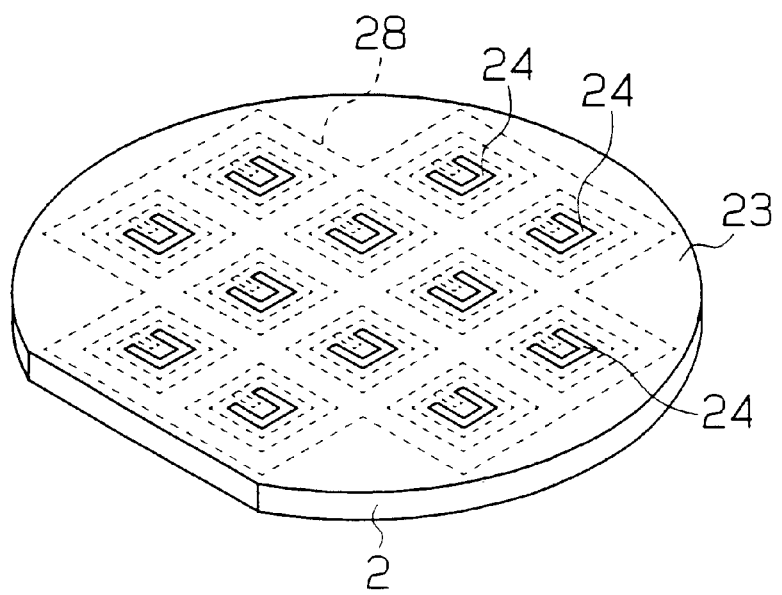
FIG. 15 is a diagrammatic perspective view showing the wafer in a manufacturing step following the step of FIG. 14.

The second embodiment further equalizes the potential applied to the silicon substrate 2 than in the first embodiment. FIG. 14 shows the silicon substrate 2 before subscribing, and FIG. 15 shows a wafer that is covered by the metal protective film 23. In FIGS. 14 and 15, the exposed portion and the opening of the p-type silicon 22 are enlarged, and the wiring patterns 9, the bonding pads 10, and the deformation gages 7 are omitted to facilitate illustration.

The steps of the manufacturing method of the present invention are the same as the steps of the first embodiment up to the step shown in FIG. 9. The rest of the steps of the second embodiment will now be described. The wiring patterns 9, the bonding pads 10, and conductive patterns 28 are formed on the silicon substrate 2 by photolithography after sputtering and vacuum vapor deposition using Al (aluminum). As shown in FIG. 14, the conductive patterns 28 are formed in a lattice structure arranged between the portions that will be the sensors on each silicon substrate (wafer) 2.

Figure 16:
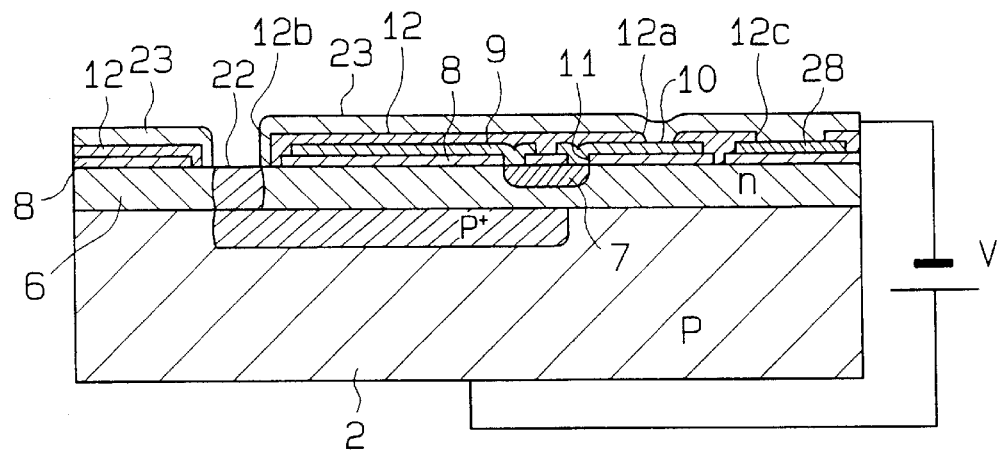
FIG. 16 is a diagrammatic cross-sectional view showing an anodization step of the second embodiment.
Figure 17:
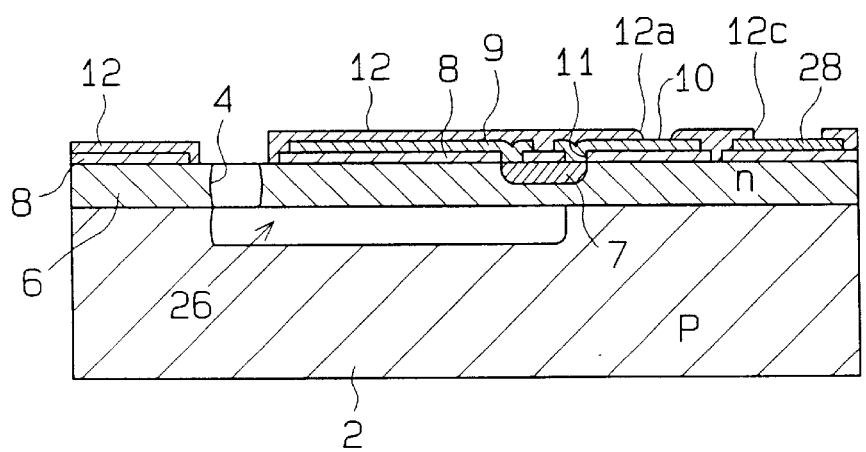
FIG. 17 is a diagrammatic cross-sectional view showing a surface-type acceleration sensor of the second embodiment.

Subsequently, as shown in FIG. 16, the passivation film 12 is formed to cover the wiring patterns 9 on the upper surface of the silicon substrate 2 by depositing SiN or $Si_3N_4$ by, for example, CVD. In the passivation step, the bonding pads 10, openings 12a for exposing the bonding pads 10 and the conductive patterns 28, the generally U-shaped opening 12b, and the openings 12c are formed on the passivation film 12. Then, the oxide film 8 on the upper surface of the p-type silicon layer 22 is removed to expose the upper surface of the p-type silicon layer 22.

Subsequently, the entire upper surface of the passivation film 12 is covered by the metal protective film 23 made of W (tungsten) by a physical film forming method such as sputtering or vacuum vapor deposition. In the film formation, W silicide is formed on the interface between the metal protective film 23 and the epitaxial growth layer of the silicon substrate 2 below the opening 12b (i.e. the opening of the oxide film 8). Also, the conductive patterns 28 are electrically connected to the metal protective film 23 via the openings 12c.

Then, as shown in FIG. 15, a generally U-shaped opening 24 is formed above the upper surface of the p-type silicon layer 22.

To perform anodization treatment, the silicon substrate 2 is immersed in an HF aqueous solution, which is a solution including HF as in the first treatment. In this state, current is applied to the silicon substrate 2 as an anode and the metal protective film 23 as a counter electrode (See FIG. 16, HF aqueous solution is not shown). In this embodiment also, the applied voltage is less than 0.6V.

In the above anodization, only the p-type silicon layers 21, 22 are turned into porous silicon layers 25. During the anodization, the portion that is covered by the metal protective film 23 is prevented from being corroded by the HF aqueous solution. Also, since HF-resistant W silicide is formed on the interface between the metal protective film 23 and the epitaxial growth layer 6 of the silicon substrate 2 at the opening 12b, the HF aqueous solution does not penetrate the interface and corrode the interior.

Subsequently, alkali etching is performed as in the first embodiment. The cavity 26 is formed by removing the porous silicon layers 25 by anisotropic etching. Finally, the metal protective film 23 is removed by etching such as plasma etching, and each element is scribed, which results in the acceleration sensor 1 shown in FIG. 17.

The second embodiment has the following advantages.

(1) In this embodiment, the conductive patterns 28 are arranged like a lattice located between each element. The conductive patterns comprise aluminum (resistance rate $\rho=2.7\ \mu\Omega cm$), which has a lower resistance rate than W (tungsten: resistance rate $\rho=5.5\ \mu\Omega cm$), which forms the metal protective film 23. Accordingly, since current flows to the conductive patterns 28 having a lower resistance rate than the metal protective film 23, distribution of potential to the wafer surface is improved, or relieved. This equalizes current and achieves equalized anodization.

Further, the metal protective film 23 may be made of Mo (molybdenum) instead of W (tungsten). In this case also, the resistance rate of the conductive patterns 28 is less than that of molybdenum ($\rho=5.2\ \mu\Omega cm$), which results in the same effect.

(2) In this embodiment, the conductive patterns 28 are made of the same material (aluminum) as the wiring patterns 9 and formed in the same manufacturing step as the wiring patterns 9 that forms the circuit. This facilitates the formation of the conductive patterns 28.

The present invention can further be varied as follows.

(1) Instead of a substrate having the orientation flat (110), a substrate having, for example, an orientation flat (111) or (100) may be used. In the first embodiment, the sensitivity of the acceleration sensor 1 is improved by using a substrate having the orientation flat (100).

(2) An alkaline etchant such as KOH, hydrazine, or EPW (ethylenediamine-pyrocatechol-water) may be used in place of THAM.

(3) The wiring patterns 9 and the bonding pads 10 are made of metals other than aluminum (Al), such as, gold (AU).

(4) An n-type multiple crystal silicon layer or amorphous silicon layer may be used to manufacture the acceleration sensor 1 instead of the n-type single crystal silicon epitaxial growth layer.

(5) Instead of the deformation gage 7 in the first embodiment, a film deformation gage made of, for example, chromium (Cr) or polycrystalline silicon may be used.

(6) In the first embodiment, a mass portion may be formed on the lower side of the distal portion of the cantilever beam 5.

(7) A bipolar IC that functions as a logic circuit may be formed on the surface of the silicon substrate 2 around the cantilever structure.

(8) In the first embodiment, instead of the W (tungsten) as the metal protective film, Mo (molybdenum) may be used. This results in the same effect. The metal protective film made of molybdenum has a high fusion point as tungsten has and has a thermal expansion coefficient close to those of the passivation film 12 and the epitaxial growth layer 6 of the silicon substrate 2, which are made of SiN or $Si_3N_4$. Therefore, the metal protective film is in close and firm contact with the passivation film 12 and the epitaxial growth layer 6.

(9) In the first and second embodiments, the metal protective film serves as the counter electrode during anodization. However, a precious metal plate such as of Pt may be used as the counter electrode as in the prior art.

Some technical terms in the specification are defined as follows.

Cantilever structure means a portion that shifts when acceleration is applied. For example, the cantilever structure may have a mass portion supported by one or more beams. Also, the cantilever structure may be only one cantilever beam not including the mass portion.

Anodization is a comprehensive quality change treatment, in which current is applied to a substrate as an anode in an electrolyte, and a porous layer is formed on the substrate.

What is claimed is:

1. A method for manufacturing a surface-type acceleration sensor comprising the steps of:

forming a first p-type silicon layer on a predetermined area of a surface of a p-type single crystal silicon substrate by adding impurities;

embedding the first p-type silicon layer below an epitaxial growth layer by forming the epitaxial growth layer, which is made of n-type single crystal silicon, on an upper surface of the first p-type single crystal silicon substrate;

forming a second p-type silicon layer for forming an opening in the epitaxial growth layer by adding impurities;

forming a deformation gage, which is made of p-type silicon, on an upper surface of the epitaxial growth layer;

forming a wiring pattern connected to the deformation gage;

forming a passivation film over the wiring pattern when the second p-type silicon layer is exposed;

forming an HF-resistant metal protective film on a surface of the passivation film and the epitaxial growth layer, but not on the second p-type silicon layer;

forming an HF-resistant metal silicide film on the interface between the metal protective film and the epitaxial growth layer when the metal protective film is formed;

performing anodization to convert the first and second p-type silicon layers into a porous silicon layer; and removing the porous silicon layer by alkali etching to form a beam that is made of the epitaxial growth layer.

2. The method for manufacturing the acceleration sensor according to claim 1, wherein the step of anodization includes a step of applying voltage to the silicon substrate that is covered with the metal protective film when the silicon substrate is immersed in a solution containing HF, and when a positive terminal of a DC power source is connected to the silicon substrate.

3. The method for manufacturing the acceleration sensor according to claim 2, wherein the step of anodization further includes a step of applying the voltage to the metal protective film together with the silicon substrate when a negative terminal of the DC power source is connected to the metal protective film.

4. The method for manufacturing the acceleration sensor according to claim 3, further including a step of forming a conductive pattern on a second portion of the silicon substrate excluding a first portion before the formation of the metal protective film.

5. The method for manufacturing the acceleration sensor according to claim 4, wherein the conductive pattern has a resistance rate lower than that of the metal protective film.

6. The method for manufacturing the acceleration sensor according to claim 2, wherein the voltage applied to the silicon substrate is less than about 0.6V.

7. The method for manufacturing the acceleration sensor according to claim 1, wherein the anodization step further includes applying the voltage to a counter electrode, which is located in the HF containing solution and is spaced from the silicon substrate, when a negative terminal of the DC power source is connected to the counter electrode.

8. The method for manufacturing the acceleration sensor according to claim 1, further including a step of removing the metal protective film.

9. A method for anodizing a silicon substrate having a first portion to be made porous and a second portion that excludes the first portion, the method comprising the steps of:

forming an HF-resistant metal protective film on a surface of the second portion of the silicon substrate;

forming an HF-resistant metal silicide film on the interface between the metal protective film and the silicon substrate when the metal protective film is formed;

immersing the substrate in a solution containing HF; and applying a voltage to the silicon substrate when the silicon substrate is immersed in the solution containing HF, and when a positive terminal of a DC power source is connected to the silicon substrate.

10. The method of anodization according to claim 9, wherein the voltage applying step includes connecting a negative terminal of the DC power source to the metal protective film.

11. The method of anodization according to claim 10 further including a step of forming a conductive pattern on the surface of the second portion of the silicon substrate before the formation of the metal protective film.

12. The method of anodization according to claim 11, wherein the conductive pattern has a resistance rate lower than that of the metal protective film.

13. The method of anodization according to claim 9, wherein the voltage applying step includes applying the voltage to a counter electrode when a negative terminal of the DC power source is connected to the counter electrode, which is located in the solution containing HF and is spaced from the silicon substrate.

14. The method of anodization according to claim 9, wherein the voltage applied is less than about 0.6V.

* * * * *